United States Patent [19]

Baudouin et al.

[11] Patent Number: 4,975,763
[45] Date of Patent: Dec. 4, 1990

[54] EDGE-MOUNTED, SURFACE-MOUNT PACKAGE FOR SEMICONDUCTOR INTEGRATED CIRCUIT DEVICES

[75] Inventors: Daniel A. Baudouin, Missouri City; Ernest J. Russell, Richmond, both of Tex.

[73] Assignee: Texas Instruments Incorporated, Dallas, Tex.

[21] Appl. No.: 168,049

[22] Filed: Mar. 14, 1988

[51] Int. Cl.$^5$ .......................... H05K 7/12; H01L 23/50
[52] U.S. Cl. .......................................... 357/74; 357/72; 361/397; 361/404; 361/417
[58] Field of Search .................. 357/74; 361/395, 412, 361/413, 415, 391

[56] References Cited

U.S. PATENT DOCUMENTS

| | | | |
|---|---|---|---|
| 3,546,362 | 12/1970 | Berger | 361/405 |
| 3,604,836 | 9/1971 | Pierpoint | 361/405 |
| 3,793,720 | 2/1974 | Van Risewijk | 361/405 |
| 4,063,791 | 12/1977 | Cutchaw | 439/331 |
| 4,246,627 | 1/1981 | Poensgen | 361/405 |
| 4,293,175 | 10/1981 | Cutchaw | 439/72 |
| 4,625,260 | 11/1986 | Jordan et al. | 361/386 |
| 4,644,096 | 2/1987 | Gutierrez et al. | 361/405 |
| 4,672,421 | 6/1987 | Lin | 361/402 |
| 4,673,967 | 6/1987 | Hingorany | 361/403 |
| 4,730,238 | 3/1988 | Cook | 361/395 |
| 4,750,092 | 6/1988 | Werther | 361/400 |
| 4,764,846 | 8/1988 | Go | 361/386 |
| 4,768,961 | 9/1988 | Lau | 361/415 |

FOREIGN PATENT DOCUMENTS

| | | | |
|---|---|---|---|
| 3611346 | 10/1987 | Fed. Rep. of Germany | 357/74 |
| 77159 | 6/1980 | Japan | 357/72 |
| 138264 | 10/1980 | Japan | . |
| 0153027 | 8/1985 | Japan | 361/405 |
| 210858 | 10/1985 | Japan | 357/68 |
| 0104148 | 5/1987 | Japan | 357/74 |
| 0163351 | 7/1987 | Japan | 357/74 |
| 219952 | 9/1987 | Japan | 357/74 |
| 63-269551 | 11/1988 | Japan | 357/74 |
| 61-51640 | 2/1989 | Japan | 357/74 |
| 61-166545 | 6/1989 | Japan | 357/74 |

OTHER PUBLICATIONS

Lahiri, "Method for Formation and Attachment of Pins to a Silicon Wafer", IBM TDB, vol. 22, No. 7, Dec. 79, pp. 2957-2958.

Primary Examiner—Andrew J. James
Assistant Examiner—Viet Q. Nguyen
Attorney, Agent, or Firm—Robby T. Holland; N. Rhys Merrett; Melvin Sharp

[57] ABSTRACT

A flat package for semiconductor integrated circuit devices allows edge-mounting and surface-mount. The package may be molded plastic containing a semiconductor chip, and flat leads extend from one edge of the package. The leads are bent to provide an area to solder to conductors on a PC board. Mechanical positioning, mechanical support and spacing are provided by studs extending from the edge of the package adjacent the leads. The studs have stops formed at a position even with flat outer surfaces of the bent leads; the portion outward of the stops fits into holes in the PC board.

16 Claims, 4 Drawing Sheets

EDGE-MOUNTED, SURFACE-MOUNT PACKAGE FOR SEMICONDUCTOR INTEGRATED CIRCUIT DEVICES

BACKGROUND OF THE INVENTION

This invention relates to semiconductor devices, and more particularly to surface-mount packages for integrated circuit devices.

Integrated circuit devices have been housed in dual-in-line plastic packages, referred to as DIP packages, in the bulk of semiconductor manufacture, for many years. These DIP packages have leads which extend through holes in a printed circuit board, and the package itself is mounted flat on the board. More recently surface-mount packaging has been introduced, and this technique eliminates the necessity of soldering leads in holes in PC boards, so the leads and PC board conductors can be closer together and higher densities are achieved. Similarly, edge-mounted packages or modules have been used in an effort to further increase the density of devices, improve cooling and reduce cost. As the density of devices and circuitry on the chips continues to increase, the packaging density must also increase, both at the package level and at the board level, while at the same time providing adequate cooling, and allowing the assembly and soldering of packages and boards to be fast, accurate and non-destructive. In particular, the packaging technique must provide protection for the leads during test, burn-in, and transport, as well as ease of positioning and mechanical support during mounting and soldering and during the life of the system.

It is a principal object of this invention to provide an improved packaging method for semiconductor integrated circuit devices. Another object is to provide an edge-mounted package for semiconductor devices that does not require soldering of leads into through-holes in a printed circuit board. A further object is to provide a surface-mount package for integrated circuits that is mechanically secure during mounting, soldering and operation, yet does not occupy space on the PC board unnecessarily. Still another object is to provide an edge-mount, surface-mount method for integrated circuit devices that allows the leads to be protected during the time from assembly to final system use, and allows accurate positioning of the leads on a PC board.

SUMMARY OF THE INVENTION

In accordance with one embodiment of the invention, a package for an integrated circuit comprises a flat housing having conductive leads extending from at least one edge, with these leads being bent or otherwise formed to allow them to be soldered to conductors on a printed circuit board in a "surface-mount" manner. To provide mechanical positioning, support and spacing, at least two protruding spacers or studs are located on the same edge of the package as the leads, and these spacers have a lip or mechanical shape to function as a stop to hold the leads in the proper position for soldering. The package can thus be "edgemounted" to save space on the PC board, while in addition the leads are "surface-mount" type in that holes in the PC for the leads are not needed. Two holes for the studs are used, but these are of a less-critical nature.

BRIEF DESCRIPTION OF THE DRAWINGS

The novel features believed characteristic of the invention are set forth in the appended claims. The invention itself, however, as well as further objects and advantages thereof, will best be understood by reference to the following detailed description of particular embodiments, when read in conjunction with the accompanying drawings, wherein:

DETAILED DESCRIPTION OF SPECIFIC EMBODIMENTS

Figure 1:
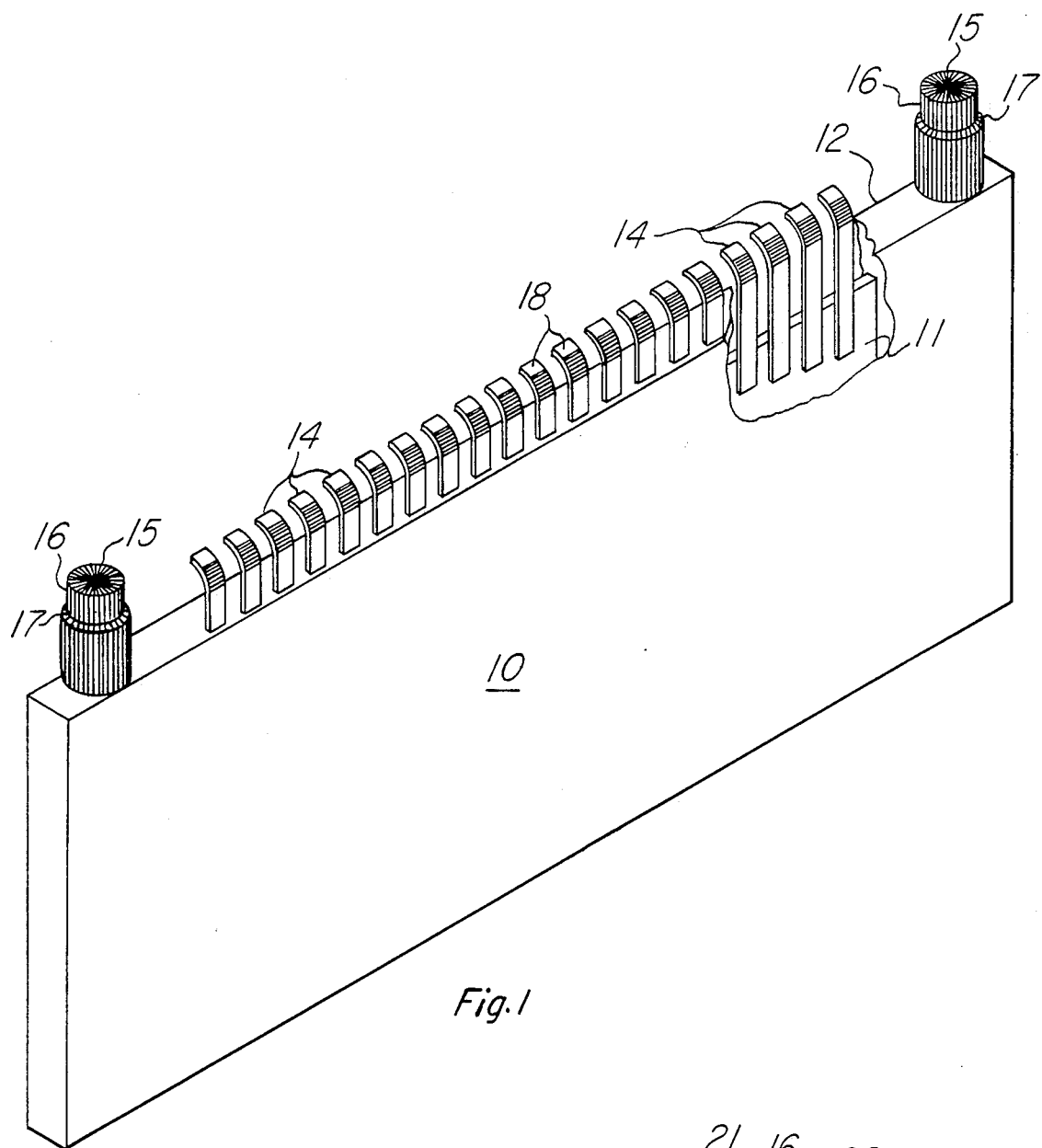
FIG. 1 is a pictorial view, partly broken away, of a package for an integrated circuit device, according to the invention.
Figure 2:
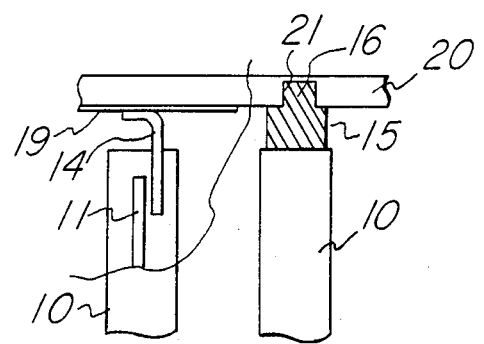
FIG. 2 is an elevation view, partly in section and partly broken away, of the package of FIG. 1 mounted in a printed circuit board.
Figure 3:
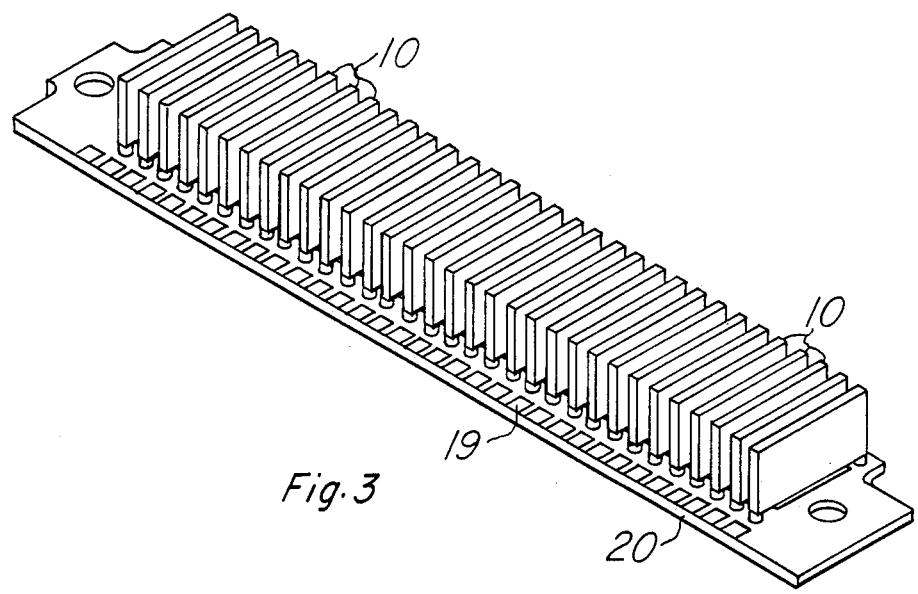
FIG. 3 is a pictorial view of a number of the packages of FIGS. 1 and 2 mounted on a PC board.

Referring now to FIG. 1 of the drawings, a package 10 for an integrated circuit chip 11 is illustrated according to one embodiment of the invention. The package is composed of injection-molded plastic 12 as is commonly used in this industry, and surrounds and contains the silicon chip 11 to proVide support and hermetic sealing, as well as to provide a means for connection to conductors on a circuit board or the like. This connection is provided by leads 14, which may be soldered to "bumps" on the chip 10 while the leads are still attached to a lead-frame as will be described. Alternatively, the leads may be connected to bonding pads on the chip 11 by wire bonding in the conventional manner. According to the invention, a pair of protruding studs or spacers 15 are positioned on the same edge of the flat package 10 as the leads 14. These studs or spacers are composed of molded plastic, just like the remainder of the package, and are formed at the same time as the package itself. The spacers include reduced-diameter cylindrical portions 16 for insertion into holes in the printed circuit board where the device is to be mounted, and include lip or stop portions 17 coplanar with the flat surfaces 18 of the leads 14 so that the leads will be positioned for soldering to the conductors 19 on the printed circuit board 20 as seen in FIGS. 2 and 3. The package 10 is mechanically supported and positioned by the cylindrical portions 16 fitting into holes 21 in the PC board 20.

In FIG. 2, a completed PC board assembly using the integrated circuit packages of FIG. 1 is illustrated. If the devices 10 are 1-Mbit or 4-Mbit DRAMs, for example, the assembly of FIG. 2 would provide thirty-two or 128 megabits of memory for a computer or the like, in a physical size of about 1×2×8 inches. The vertical positioning of the packages 10, with both flat faces free, provides excellent cooling.

Figure 4:
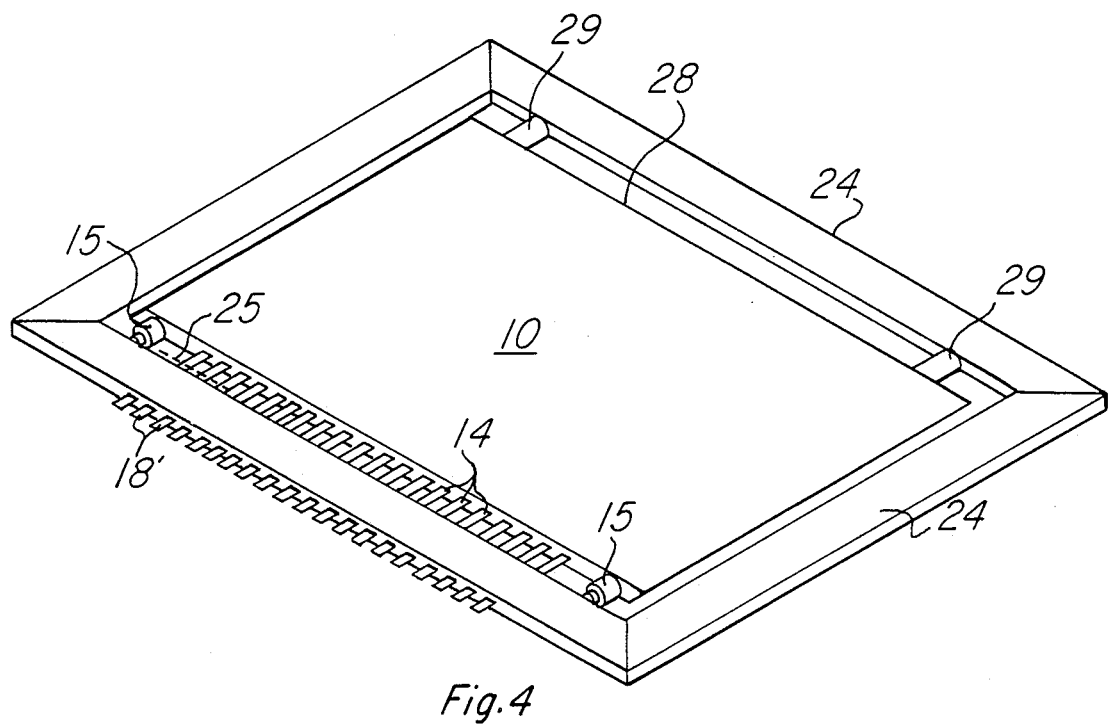
FIG. 4 is a plan view of the package of FIG. 1 while still surrounded by a frame used in the manufacture thereof.

Referring now to FIG. 4, a preferred way of making the package 10 of FIG. 1 is to mold a frame 24 around the package at the same time as the plastic package itself is molded. This frame 24 surrounds the package 10 and is as thick as or thicker than the package. The leads 14 extend through the frame 24 and are formed in a shape suitable for testing and burn-in; that is, the leads 14 are shown in FIG. 4 in a form prior to having been cut and bent to the final form as seen in FIG. 1, but instead are shaped at their outer ends 18' to be exposed for electrical contact exterior to the frame 24. Ultimately, the leads 14 are cut along the line 25 and bent to the shape of FIG. 1. The purpose of the frame 24 is to provide mechanical protection to the package 10 and leads 14; this protection is due to the dimensions of the frame and due to the fact that all testing and burn-in connections as well as mechanical handling are effected to the frame 24 or on outer ends 181 of the leads 14 outside the frame 24, thus leaving the package 10 and leads 14 inside the frame unmolested. Just before assembly the frame 24 is trimmed away from the package 10. To provide additional mechanical support during handling, the edge 28 of the package 10 may have plastic studs 29 extending to the frame 24; these would be clipped when the leads 14 are clipped, and so would not be part of the final package as it is seen in FIG. 1.

Figure 5:
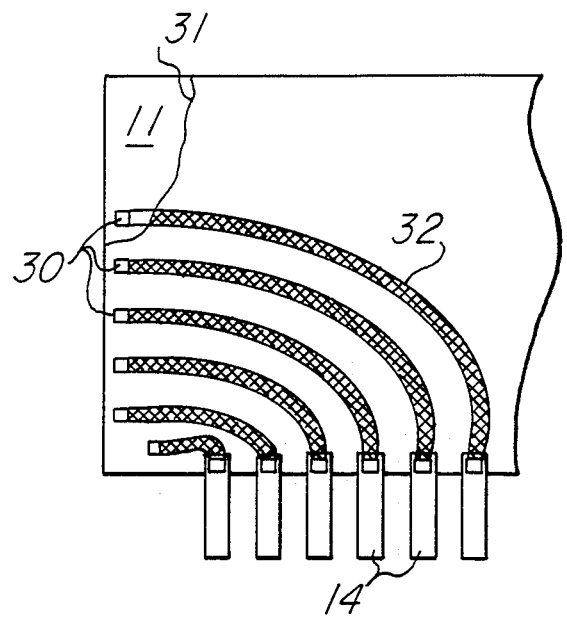
FIG. 5 is a view of a semiconductor chip before it is molded into the package of FIG. 1.

Turning now to FIG. 5, the chip 11 is shown to have bonding pads 30 formed in the usual manner when the upper level of metallization is applied. These bonding pads correspond to the ones usually having leads bonded thereto in the more traditional packaging methods. Instead, another layer of insulator 31 is added, and patterned using photoresist to open holes over the bonding pads 30, then an additional metal layer is applied and patterned to leave traces 32 running over to the edge where the leads 14 are to be connected. Solder bumps are applied to the ends of the traces 32 to accommodate the leads 14, which may be bonded to the solder bumps while in the same jig used to hold the assembly while the frame 24 and plastic body 10 are being molded; in this manner, the chip and leads need not be handled at a time when the leads are not mechanically secure.

Figure 6:
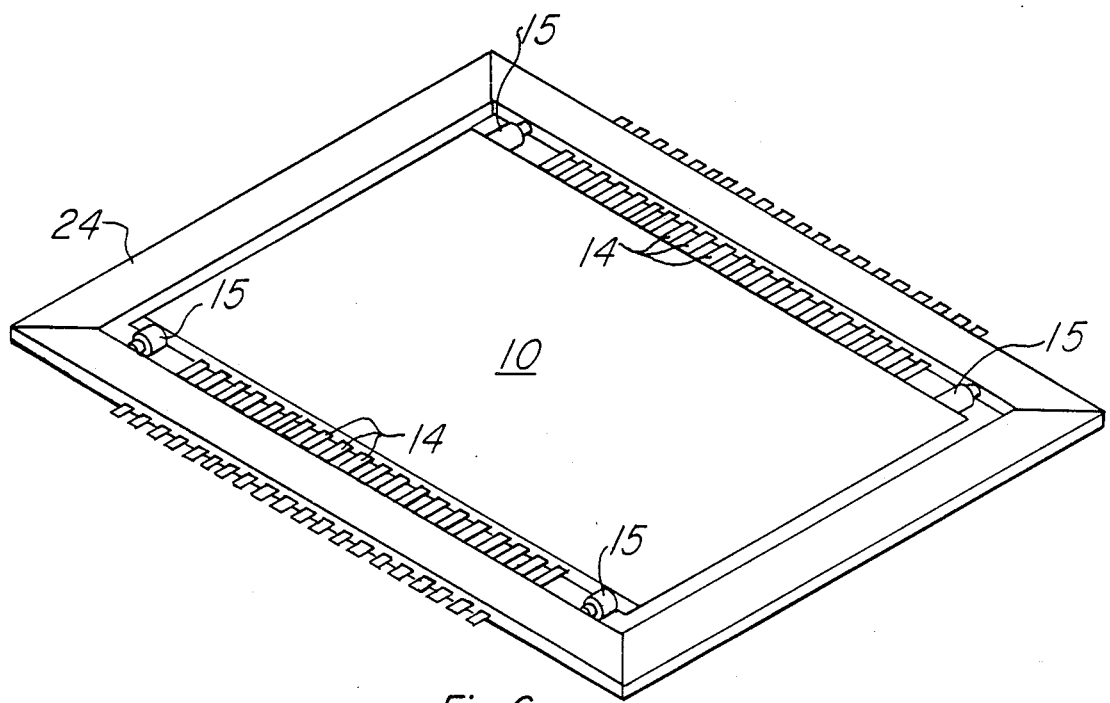
FIG. 6 is a pictorial view of another embodiment of the package of FIG. 1, in this case having leads extending from opposite edges, while still in the frame as in FIG. 4.
Figure 7:
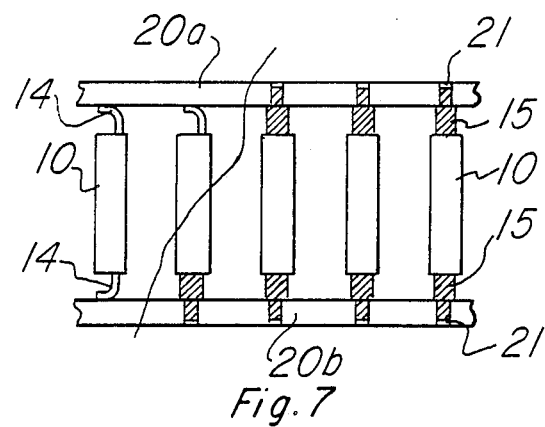
FIG. 7 is an elevation view of the embodiment of the invention of FIG. 6, mounted between two PC boards.

In another embodiment, the package 10 of the invention may be formed with leads 14 on both upper and lower sides, as seen in FIG. 6. This double-sided edge-mounted package would be mounted between two printed circuit boards 20a and 20b as seen in FIG. 7. This embodiment may be useful if the integrated circuit device has a large number of leads; microprocessor devices or application-specific (ASIC) devices may have, for example, forty-eight, sixty-four, or more, of the leads 14. Or, alternatively, the package 10 may have the studs 15 on both opposite edges as seen in FIG. 6, but have leads 14 extending from only one edge, so that electrical connection is made to only one of the boards 20a or 20b of FIG. 7 and the other board is a copper heat sink and ground plane; there may be leads 14 for ground connections, but no logic connections, extending from the edge near the copper ground plane. Another advantage of the configuration of FIG. 7 is that the packages 10 act as air paths so air blown through the assembly for cooling will be confined along the desired paths from one side to the other.

Figure 8:
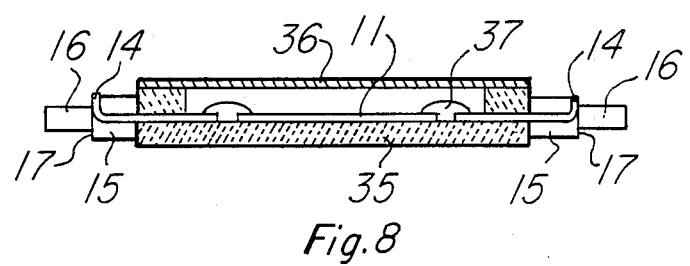
FIG. 8 is an elevation view in section of another embodiment of the invention using a ceramic package instead of a plastic package.

Although described above in reference to plastic encapsulated packages 10, the concept of the invention may be utilized in ceramic packaged devices as illustrated in FIG. 8. Here a ceramic header 35 has the leads 14 sealed therein; the leads 14 extend through the shallow walls of the package and are bent as before to allow surface mount. Studs 15 are made of metal or plastic and are brazed or adhesively bonded to the edges of the package to create the same physical shape as in FIG. 1. A metal lid 36 seals the package as is usual for ceramic semiconductor packages. Wires 37 are bonded between bonding pads on the chip 11 and the inner ends of the leads 14.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A flat, edge-mounted, surface-mount semiconductor integrated circuit device or the like, comprising:
    a relatively flat package encapsulating a semiconductor chip, said chip having a plurality of bonding pads along at least one edge,
    a plurality of conductive leads extending from at least one edge of said package, the leads being electrically connected to said bonding pads,
    and a plurality of studs integral with said package extending from said at least one edge of said package, said studs being shaped to fit into holes in a printed circuit board for mechanically positioning and supporting the package when said leads are soldered to the printed circuit board.

2. A device according to claim 1 wherein said package is composed of plastic molded around said chip and said leads.

3. A device according to claim 1 wherein said leads are bent to present a face generally perpendicular to said flat package.

4. A device according to claim 1 wherein said studs each have a stop formed thereon to limit the extension of the stud into the printed circuit board and provide a selected spacing between the edge of the package and the printed circuit board.

5. A device according to claim 1 wherein said studs are composed of non-conductive material.

6. A device according to claim 5 wherein said leads are bent to present a face generally perpendicular to the printed circuit board and aligned with said stop.

7. A device according to claim 6 wherein said package and said studs are composed of molded plastic.

8. A device according to claim 1 wherein said package is a shallow ceramic header and said chip is mounted within a recess in said header.

9. A plastic frame and package combination for use in the manufacture of semiconductor devices, comprising
    a flat plastic package containing a semiconductor chip,
    a plastic frame surrounding said package but spaced therefrom, generally coplanar with said package,
    a plurality of conductive leads extending from one edge of said package and through one side of said frame,
    and a plurality of studs composed of nonconductive material integral with said package extending from said one edge of said package.

10. A device according to claim 9 wherein said studs include a stop formed thereon to provide a lip.

11. A device according to claim 10 wherein said leads are exposed between said one edge of said package and said frame for a distance sufficent to clip the leads and bend the leads so the clipped bent ends form a generally flat coplanar surface with the face of said stops of said studs.

12. A device according to claim 11 wherein said studs have a reduced portion connected to said stop for insertion into a hole in a printed circuit board when said clipped bent ends of said leads are soldered to a conductor on the printed circuit board.

13. A flat, plastic-encapsulated, edge-mounted, surface-mount semiconductor integrated circuit device or the like, comprising:
 a relatively flat plastic package encapsulating a semiconductor chip, said chip having a plurality of bonding pads along at least one edge,
 a plurality of conductive leads extending from at least one edge of said package, each of said leads being electrically connected to one of said bonding pads, and a plurality of non-conductive plastic studs integral with said package extending from said at least one edge of said package, said studs being shaped to fit into holes in a printed circuit board for mechanically positioning and supporting the package when said leads are soldered to the printed circuit board.

14. A device according to claim 13 wherein said package is composed of plastic molded around said chip and said leads to hermetically seal the chip and leads except where the leads extend from said edge.

15. A device according to claim 14 wherein said studs each have a cylindrical end-piece and have a stop formed on said stud to limit the extension of said stud into holes in the printed circuit board and provide a selected spacing between the edge of the package and the printed circuit board.

16. A device according to claim 15 wherein said leads are bent in alignment with the face of said stop.

* * * * *